(12) United States Patent
Soberay

(10) Patent No.: US 6,662,841 B2
(45) Date of Patent: Dec. 16, 2003

(54) LOW PROFILE VACUUM PRESS

(75) Inventor: Thaddeus Soberay, Brecksville, OH (US)

(73) Assignee: Technical Machine Products, Cleveland, OH (US)

( * ) Notice: Subject to any disclaimer, the term of this patent is extended or adjusted under 35 U.S.C. 154(b) by 0 days.

(21) Appl. No.: 10/390,290

(22) Filed: Mar. 17, 2003

(65) Prior Publication Data

US 2003/0183345 A1 Oct. 2, 2003

Related U.S. Application Data

(63) Continuation of application No. 09/953,991, filed on Sep. 12, 2001, now abandoned.

(51) Int. Cl.⁷ .................................................. B30B 15/00
(52) U.S. Cl. ...................... 156/382; 156/580; 156/583.1
(58) Field of Search ................................. 156/228, 285, 156/286, 288, 382, 580, 583.1

(56) References Cited

U.S. PATENT DOCUMENTS

| | | |
|---|---|---|
| 631,286 A | 8/1899 | Euston |
| 697,287 A | 4/1902 | Spaulding |
| 2,349,805 A | 5/1944 | Tapper |
| 2,500,791 A | 3/1950 | Baldwin |
| 2,558,796 A | 7/1951 | Tapper |
| 2,565,639 A | 8/1951 | Waldie |
| 3,526,188 A | 9/1970 | Carlsson |
| 3,757,680 A | 9/1973 | Williams |
| 4,157,066 A | 6/1979 | Pretty |
| 4,203,359 A | 5/1980 | Baltschun |
| 4,351,724 A | 9/1982 | Jones |
| 4,597,322 A | 7/1986 | Garnjost et al. |
| 4,666,551 A | 5/1987 | Soberay et al. |
| 4,857,135 A | 8/1989 | Copp |
| 4,963,221 A | 10/1990 | Isobe et al. |
| 5,182,121 A | 1/1993 | Miyashita et al. |
| 5,496,433 A | 3/1996 | Miyashita et al. |
| 5,892,203 A | 4/1999 | Jordan et al. |
| 5,972,150 A | 10/1999 | Copp |
| 5,987,736 A | 11/1999 | Copp |
| 6,106,269 A | 8/2000 | Soberay et al. |

OTHER PUBLICATIONS

Two–sided advertisement, Sep. 23, 1985, *Rubber & Plastic News*, p. 153 of Karder Machine Co., opposite page MKB Industries, Inc.

(List continued on next page.)

*Primary Examiner*—James Sells
(74) *Attorney, Agent, or Firm*—Watts Hoffmann Co., L.P.A.

(57) ABSTRACT

A vacuum press for bonding a plurality of laminar substrates that features a processing chamber having an interior portion defined by two side walls, front and rear walls, and a chamber floor. A lower bolster member is disposed within the processing chamber and an upper force transfer member is connected to the lower bolster member such that movement in the upper force transfer member and produces concurrent movement in the lower bolster member. A stationary bolster member that defines a chamber ceiling is maintained between the upper force transfer member and the lower bolster member such that distance between the upper force transfer member and the stationary bolster member can vary. An actuator is connected to the upper force transfer member. The actuator moves the upper force transfer member between a load position and a press position. A plurality of platens having an support surface onto which the laminar substrate is placed and a lower force receiving surface are disposed in within the processing chamber aligned with the lower bolster such that as the lower bolster member is moved by the actuator toward the pressing position, the platens move into confronting engagement such that clamping forces are applied to the platens by the actuator.

16 Claims, 3 Drawing Sheets

OTHER PUBLICATIONS 4 pp product literature "Daniels Hydramold—Hinged Platen Presses for Rubber Moulding".

Two–sided product literature from BIPEL Limited.

Two–sided product literature from Technical Machine Products of Cleveland, Ohio.

12 pp product literature catalog from Wabash Hydraulic Press Divn. Of Wabash Metal Products, Inc. of Wabash, IN, "Wabash Hydraulic Compression Presses".

4 pp product literature of BIPEL on MICROMOULD 50.

F. Johannaber, "Injection Molding Machines—$3^{rd}$ Edition," 5 pages, Hanser Publishers (1994).

2 pp. New product release from Vacuum–Press Intl., Inc. Feb. 4, 1984, "Vacuum Press Capabilities".

4 pp document of Vacuum–Press Intl., Inc. by Bob Carter, "Introduction to Vacuum Presses."

4 pp document of Vacuum–Press Intl., Inc. "General Specifications—Series 24 Vacuum Press."

4 pp. document of Vacuum–Press Intl., Inc., "General Specifications—Series 30—Series 42 Vacuum Press."

Two–side product literature from Vacuum–Press Intl., Inc. A Revolutionary New Laminating Press for Multi–Layer Technology.

Three–side product literature folder of Vacuum–Press Intl., Inc., Introducing a Revolutionary Concept of Multi–layer Technology.

LOW PROFILE VACUUM PRESS

This application is a continuation of 09/953,991 filed Sep. 12, 2001, now abandoned.

TECHNICAL FIELD

The present invention relates generally to molding and, in particular to a vacuum press for molding multiple laminar products.

BACKGROUND

Electrical circuit boards are typically constructed by bonding a plurality of substrates or layers of material together to produce a rigid structure having desired electrical properties. Depending on the application, the individual substrates may be electrically insulating or electrically conductive. A conductive layer usually comprises a relatively thin film of conducting foil such as copper which may define an electrical circuit. Insulating layers are constructed from suitable dielectric or insulating materials.

Circuit boards can be manufactured using a batch process in which individual cut sheets of substrate are stacked one atop the other and are bonded together to form the unitary, rigid board. Batch processes are typically carried out using either a hydraulic press or a pressure vessel. In the first method, the layers of substrates are impregnated with a liquid resin composition or other material, often termed "prepreg." The impregnated layers are then stacked, registered and placed within a pressure platen assembly forming part of the hydraulic press. The stack is then compressed by the platen assembly and heated to an elevated temperature. The combination of pressure and heat softens the prepreg and causes bonding between the individual layers. The high pressures and heat necessary to achieve bonding, if not carefully controlled, can cause problems in the finished product. For example, the high pressure can cause dimensional changes in the boards as well as misregistration between the layers. The heat and pressure if not uniform can also cause warping and twisting in the boards. It has been found that complex, multilayer applications cannot be readily produced using a conventional hydraulic press because an excessive scrap rate makes the process economically disadvantageous.

The use of an evacuated process chamber in which the circuit boards are bonded reduces the need for high pressure. U.S. Pat. No. 4,666,551 to Soberay et al. discloses a vacuum press that uses an evacuated process chamber having a hydraulic ram mounted below the platen assemblies and within the process chamber. While this press is commercially successful, it is believed that the placement of the hydraulic ram within the vacuum chamber introduces a risk of contaminating the chamber with hydraulic fluid and makes maintenance difficult. The height of the process chamber is dictated to some extent by the footprint of the hydraulic ram, so that it may be necessary to excavate below the press or have an operator stand on a platform to operate the press.

SUMMARY OF THE INVENTION

The present invention provides a new and improved vacuum press for bonding a plurality of laminar substrates that features an upward acting ram assembly that is mounted above the pressing platens to eliminate the need to provide a pit below operator height to accommodate a ram. According to the present invention, the ram assembly may be located outside the vacuum chamber to facilitate maintenance and minimize chamber contamination due to the presence of hydraulic fluid and/or oil associated with the ram.

A processing chamber having an interior portion defined by two side walls, front and rear walls, a chamber ceiling, and a chamber floor encloses a lower bolster member. An upper force transfer member is connected to the lower bolster member so that movement in the upper force transfer member produces concurrent movement in the lower bolster member. A stationary bolster member is maintained between the upper force transfer member and the lower bolster member such that distance between the upper force transfer member and the stationary bolster member can vary.

A ram or actuator is connected to the upper force transfer member. The actuator moves the upper force transfer member between a load position and a press position. A plurality of platens having an upper surface onto which the laminar substrate is placed and a lower force receiving surface are disposed within the processing chamber between the chamber ceiling and the lower bolster member. The platens are in predetermined alignment with the lower bolster member and as the lower bolster member is moved by the actuator toward the pressing position, the platens move into confronting engagement such that clamping forces are applied to the platens by the actuator.

In an exemplary embodiment, the stationary bolster member defines the ceiling of the chamber such that a lower surface of the stationary bolster member in located within the chamber and an upper surface of the stationary bolster member is located outside the chamber. The upper force transfer member is connected to the lower bolster member by a plurality of connecting rods and the connecting rods are in sealed sliding engagement with the stationary bolster member through apertures in the stationary bolster member. A hydraulic cylinder having an extendable rod substantially enclosed by a housing is mounted between the upper force transfer member and the stationary bolster member to move the upper force transfer member relative to the stationary bolster member.

According to a feature of the exemplary embodiment, each of the platens is suspended from the stationary bolster member on a set of hanger rods. The sets of hanger rods have staggered lengths so that an uppermost platen is suspended by a set of shortest hanger rods and a lowermost platen is suspended by a set of longest hanger rods. The hanger rods slidably protrude through the platens and engage a collar that limits downward movement of the platen and upward movement of the platen is allowed as the lower bolster member contacts the lowermost platen and slides the platens along their hanger rods toward the stationary bolster member. The lower bolster member has openings that allow the hanger rods to extend through the lower bolster as the lower bolster moves to the pressing position.

A seal assembly is disposed within the stationary bolster member aperture such that the assembly is accessible to outside the processing chamber. The seal assembly seals between the connecting rod and the stationary bolster member to inhibit vacuum leakage from the chamber as the connecting rods move therethrough.

Additional features of the invention will become apparent and a fuller understanding obtained by reading the following detailed description made in connection with the accompanying drawings.

DETAILED DESCRIPTION OF THE PREFERRED EMBODIMENT

Figure 1:
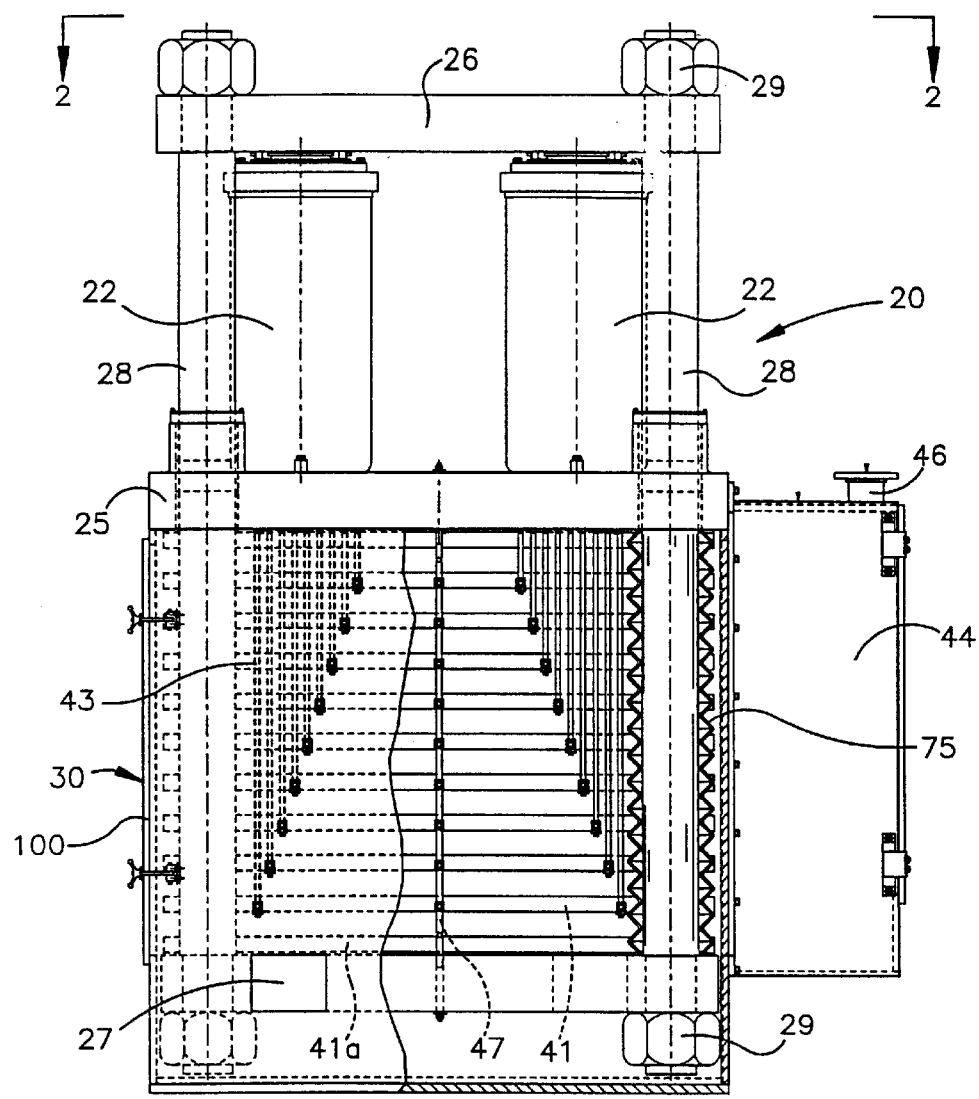
FIG. 1 is a side plan view with a cross section in phantom of a vacuum press constructed in accordance with the present invention.

Referring to the figures and in particular to FIG. 1, a vacuum press 20 constructed in accordance with the present invention is illustrated. The vacuum press 20 has a vacuum chamber 30. A top wall of the chamber 30 is defined by a stationary bolster 25 through which four strain rods 28 slidably protrude. The strain rods are covered with a bellows type rubber seal 75 (shown on a single rod in FIG. 1) that has a hole therein to equalize pressure across the seal (not shown). A lower bolster 27 is retained on a lower end of the strain rods 28 by a nut threaded onto each rod. The lower bolster 27 and the corresponding strain rod ends and nuts 29 are enclosed within the vacuum chamber 30. A vacuum line (not shown) evacuates the air from the chamber 30 during the molding process.

A plurality of heated platens 41 are suspended within the vacuum chamber 30 on hanger rods 43. Each platen 41 supports a set of laminar layers to be molded together using heat and pressure to form a circuit board. The platens 41 are heated with hot oil (not shown) that circulates within the platens. The hot oil flows into a hot oil manifold 44 that has inlet and outlet ports 45, 46 (shown in FIG. 2). Hot oil is supplied to the inlet port 45 and cooled oil is discharged out of the outlet port 46. In the described embodiment, each platen 41 except the lowermost platen 41a is suspended from the stationary bolster 25 by a set of four hanger rods 43. It will be recognized by one of skill in the art that other methods of mounting the platens such as stair step notches on the supporting members as well as other heating means such as steam or electricity can also be used to practice the invention. A lowermost platen 41a is mounted to the lower bolster 27 with four screws 31 (FIG. 3). The lengths and placement of the hanger rod sets are staggered as shown in FIG. 1 so that multiple platens can be suspended without interference between the hanger rods. A pair of aligning rods 47 connect to each platen 41, the stationary bolster 25 and the lower bolster 27 to maintain the vertical alignment of the platens relative to one another.

Figure 9:
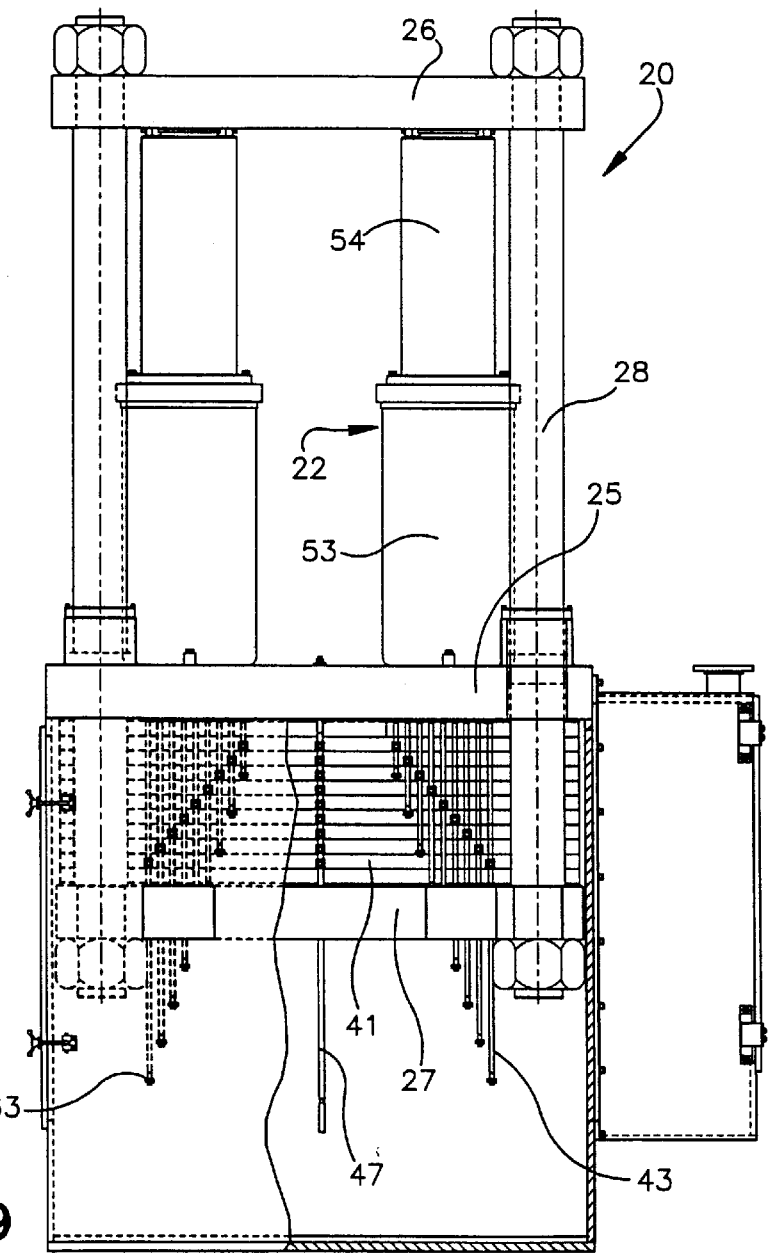
FIG. 9 is a cross section view of the press of FIG. 1 during press operation.

An upper force transmitting member, or bolster, 26 slidably engages an upper end of the strain rods 28 and is retained on the strain rods 28 by nuts 29. A pair of hydraulic ram cylinders 22 are disposed between the upper bolster 26 and the stationary bolster 25 and define the distance therebetween. While the described embodiment features a pair of cylinders, one of skill in the art would recognize that any appropriate number of cylinders can be used in the practice of the present invention. FIG. 1 illustrates the cylinders 22 in a fully retracted position that places the platens 41 in a spaced apart configuration optimal for material loading and unloading. FIG. 9 illustrates the cylinders in a fully extended position in which the press is supplying the pressure necessary to mold the laminar layers into a circuit board.

Figure 2:
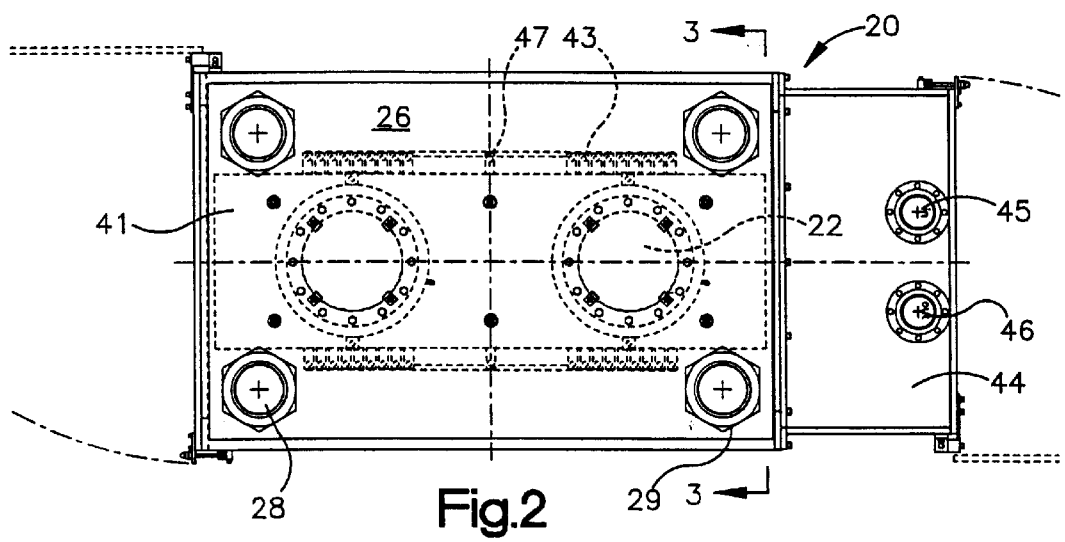
FIG. 2 is a top plan view of the press shown in FIG. 1.
Figure 3:
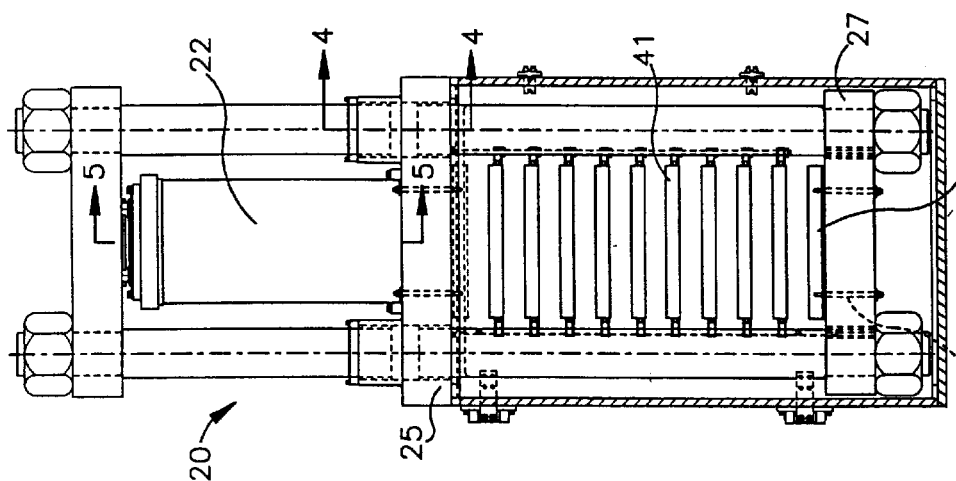
FIG. 3 is a front cross section view of the press shown in FIG. 1.

FIG. 2 is a top view of the press 20 in which the staggered position of the hanger rods 43 is evident. The platens 41 are suspended on their hanger rods 43 between the four strain rods 28 and the two cylinders 22 are mounted on the underside of the upper bolster 26. FIG. 3 is a front view of the press 20 that illustrates the connection of the lowermost platen 41a to the lower bolster and the connection between the cylinders 22 and the stationary bolster 25. A door 100 (shown in FIG. 1) provides access to the vacuum chamber 30 for placement of material to be molded as well as maintenance. As can be seen from FIG. 3, the press 20 provides a vacuum chamber 30 at a height that is easily accessible to press operators and maintenance personnel.

Figure 4:
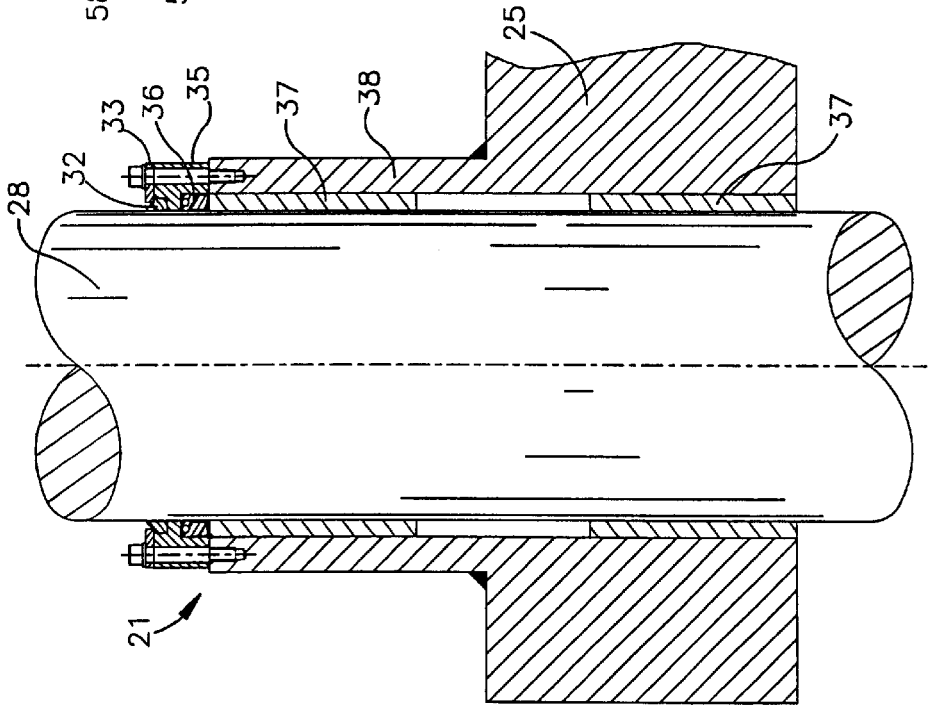
FIG. 4 is an enlarged view of the strain rod of the press shown in FIG. 1.

As can be seen in FIG. 4, the stationary bolster 25 has four heads 38 welded to its top surface that have a vacuum seal assembly shown generally as 21 through which the strain rod 28 extends. The vacuum seal 21 prevents leakage of air into the vacuum chamber when the strain rod moves within the stationary bolster 25. The vacuum seal 21 has a strain rod wiper 32 that is mounted for sealed. sliding engagement with the strain rod 28. The rod wiper 32 is retained in engagement with the strain rod with a split retaining ring 33. A rod seal 36 is maintained in sealed sliding engagement with the strain rod 28 with a seal cap 35 to provide sealing against leakage of air into the vacuum chamber 30 (FIG. 1). The rod seal 36 is split to facilitate installation and removal. Two brass guide bushings 37 align the strain rod 28 within the head 38 to maintain constant engagement between the strain rod and the rod wiper 32 and rod seal 36. The seal assembly 21 is conveniently located outside and above the vacuum chamber 30 to facilitate maintenance of the seal assembly.

Figure 5:
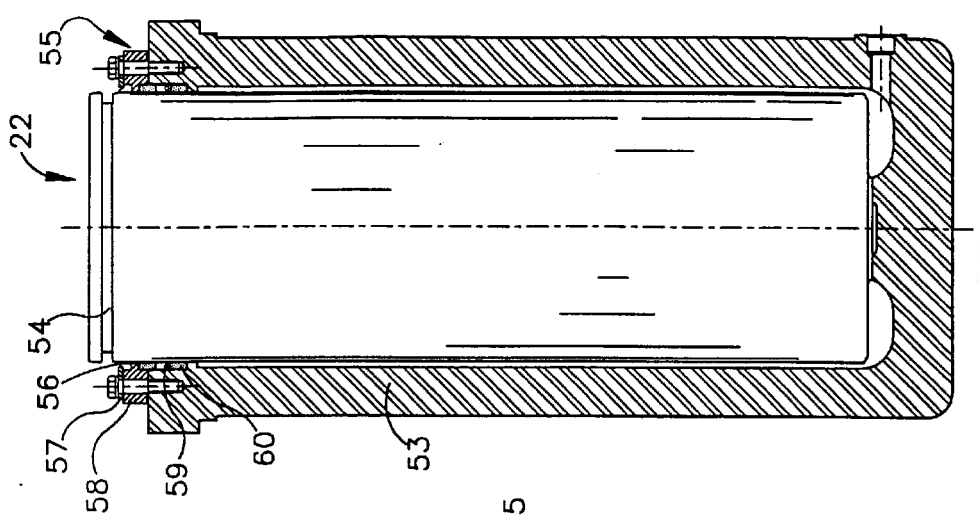
FIG. 5 is an enlarged view of the hydraulic ram of the press shown in FIG. 1.

FIG. 5 illustrates in more detail the hydraulic cylinder 22. The cylinder body 53 houses a cylinder seal assembly shown generally as 55 that prevents hydraulic fluid leakage from the body as a cylinder ram 54 extends from and retracts into the housing. The seal assembly 55 has a cylinder rod wiper 56 that is mounted for sealed sliding engagement with the cylinder rod 54. The rod wiper 56 is retained in engagement with the cylinder rod with a retaining ring 57. A ram seal. 59 is maintained in sealed sliding engagement with the cylinder rod 54 with a cylinder seal cap 58 to provide sealing against leakage of hydraulic fluid from the body 53. A brass thrust liner 60 aligns and supports the rod 54 within the body 53. As with the seal assembly 21, the cylinder seal assembly 55 is conveniently located outside and above the vacuum chamber 30 to facilitate maintenance of the seal assembly.

Figure 6:
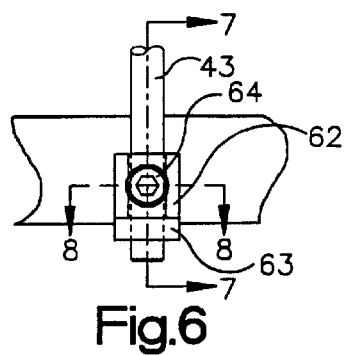
FIG. 6 is an enlarged fragmentary view of a hanger rod of the press shown in FIG. 1.
Figure 7:
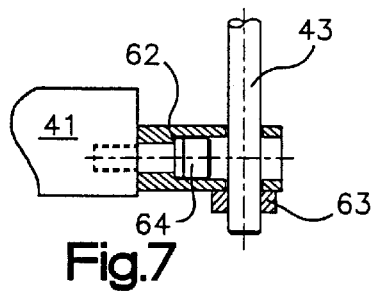
FIG. 7 is a cross section view of the hanger rod of the press shown in FIG. 1.
Figure 8:
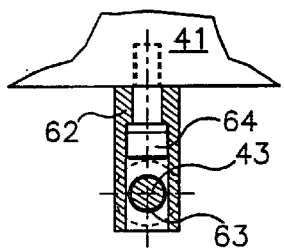
FIG. 8 is a cross section view of the hanger rod of the press shown in FIG. 1.

FIGS. 6–8 illustrate the connection between a platen 41 and a hanger rod 43 also shown in FIGS. 1–3. Each platen 41 is connected at its periphery to four associated hanger blocks 62 with a hanger screw 64 that is countersunk into the block to allowance clearance for passage of the hanger rod 43 through the hanger block. The hanger rod 43 protrudes through the hanger block 62 and a locking collar 63 maintains the hanger rod within the block. The height of the platen 41 is therefore adjustable by moving the hanger rod 43 within the hanger block 62 and securing the rod in the block once the desired platen height is reached. The locating rods are secured to each platen 41 in a similar fashion. In this manner, the platen 41 is free to slide up and away from the locking collar 63 on the hanger rod 43, but travel in the downward direction is limited by the collar. This allows the platens 41 to be brought into squeezing engagement with each other by raising the lower bolster 27 as will be discussed in conjunction with FIG. 9.

FIG. 9 illustrates the vacuum press 20 in a molding position in which the platens 41 are in squeezing engagement with one another. The cylinder 22 is in its fully extended position wherein the cylinder rod 54 has been hydraulically driven out of the cylinder body 53 to lift the lower bolster 27 and thereby apply a predetermined amount of pressure between the stationary and lower bolsters 25,26. The heat of the platens 41 and the pressure from the cylinder mold the laminations (not shown) into a unitary board. As the lower bolster 27 is raised by the cylinders, the hanger rods 43 having relatively long lengths protrude through openings provided in the lower bolster and the lower bolster thereby pushes the platens 41 together to perform the molding operation. Because the stationary bolster 5 and the lower bolster 27 tend to deflect in the same direction during the mold operation, the possibility of irregularities in the molded product due to deflection of the bolsters is decreased.

As can be seen from the foregoing description, a vacuum press has been provided that has a low operating height and relatively easy access to strain rod and ram seals. In addition, by placing the hydraulic cylinders outside the vacuum chamber, hydraulic oil contamination of the chamber is prevented. While the invention has been described with a certain degree of particularity it should be understood that those skilled in the art can make various changes to it without departing from the spirit of scope of the invention as hereinafter claimed.

I claim:

1. A vacuum press for bonding a plurality of laminar substrates comprising:
   a processing chamber having an interior portion defined by two side walls, front and rear walls, a chamber ceiling, and a chamber floor;
   a lower bolster member disposed within the processing chamber having a force applying surface;
   an upper force transfer member connected to the lower bolster member such that movement in the upper force transfer member produces concurrent movement in the lower bolster member;
   a stationary bolster member maintained between the upper force transfer member and the lower bolster member such that distance between the upper force transfer member and the stationary bolster member can vary;
   an actuator connected to the upper force transfer member that moves the upper force transfer member between a load position and a press position; and
   a plurality of platens having a support surface onto which the laminar substrate is placed and a lower force receiving surface, wherein the platens are disposed within the processing chamber between the chamber ceiling and the lower bolster member and in predetermined alignment therewith and wherein as the lower bolster member is moved by the actuator toward the pressing position, the platens move into confronting engagement such that clamping forces are applied to the platens by the actuator.

2. The vacuum press of claim 1 wherein the stationary bolster member defines the ceiling of the chamber such that a lower surface of the stationary bolster member in located within the chamber and an upper surface of the stationary bolster member is located outside the chamber.

3. The vacuum press of claim 2 wherein the upper force transfer member is connected to the lower bolster member by a plurality of connecting rods and wherein the connecting rods are in sealed sliding engagement with the stationary bolster member through apertures in the stationary bolster member.

4. The vacuum press of claim 1 wherein the actuator comprises a hydraulic cylinder having an extendable rod substantially enclosed by a housing mounted above the stationary bolster member and wherein the extendable rod is connected to the upper force transfer member.

5. The vacuum press of claim 1 wherein each of the platens is suspended from the stationary bolster member on a set of hanger rods wherein the sets of hanger rods have staggered lengths so that an uppermost platen is suspended by a set of shortest hanger rods and a lowermost platen is suspended by a set of longest hanger rods.

6. The vacuum press of claim 5 wherein the hanger rods slidably protrude through the platens and engage a collar that limits downward movement of the platen and wherein upward movement of the platen is allowed as the lower bolster member contacts the lowermost platen and slides the platens along their hanger rods toward the stationary bolster member.

7. The vacuum press of claim 6 wherein the lower bolster member has openings that allow the hanger rods to extend through the lower bolster as the lower bolster moves to the pressing position.

8. The vacuum press of claim 3 comprising a seal assembly disposed within the stationary bolster member aperture that inhibits vacuum leakage from the chamber as the connecting rods move therethrough.

9. The vacuum press of claim 8 wherein the seal assembly is accessible from outside the processing chamber.

10. The vacuum press of claim 2 comprising collapsible seals enveloping the connecting rods within the processing chamber.

11. A vacuum press comprising:
    an enclosed processing chamber;
    a movable bolster member disposed within said processing chamber, having a force applying surface;
    a force transfer member connected to the moveable bolster member such that movement in the force transfer member produces concurrent movement in the moveable bolster member;
    a stationary bolster member maintained between the force transfer member and the movable bolster member, such that a distance between the force transfer member and the stationary member can vary;
    at least one fluid pressure operated actuator connected to the force transfer member that moves the force transfer member between a load position and a press position; and,
    a plurality of platens having a product support surface and a force receiving surface, wherein the platens are disposed within the processing chamber between the moveable bolster member and a chamber receiving wall that is positioned in a spaced apart confronting relationship with said movable bolster member and in predetermined alignment therewith and wherein as the movable bolster member is moved by the fluid pressure operated actuator toward the pressing position, the platens move into confronting engagement, such that clamping forces are applied to the platens by the fluid pressure operated actuator.

12. The vacuum press of claim 11, wherein said vacuum press includes a second fluid pressure operated actuator spaced from said first fluid pressure operated actuator and connected to the upper force transfer member, such that the actuators apply clamping forces to the platens as the platens move into confronting engagement.

13. A vacuum press comprising:

an enclosed processing chamber;

a movable bolster member disposed within said processing chamber, having a force applying surface;

a force transfer member connected to the moveable bolster member such that movement in the force transfer member produces concurrent movement in the moveable bolster member;

a stationary bolster member maintained between the force transfer member and the movable bolster member, such that a distance between the force transfer member and the stationary member can vary;

a plurality of actuators connected to the force transfer member that move the force transfer member between a load position and a press position; and, a plurality of platens having a product support surface and a force receiving surface, wherein the platens are disposed within the processing chamber between the bolster member and a chamber receiving wall that is positioned in a spaced, confronting relationship with said movable bolster member and in predetermined alignment therewith and wherein as the movable bolster member is moved by the fluid pressure operated actuators toward the pressing position, the platens move into confronting engagement, such that clamping forces are applied to the platens by the fluid pressure operated actuators.

14. The apparatus of claim 13, wherein the force transfer member is located above the moveable bolster member.

15. The apparatus of claim 14, wherein the moveable bolster member moves upwardly as it moves towards its pressing position.

16. The apparatus of claim 13, wherein said plurality of fluid pressure operated actuators comprises two spaced apart actuators connected to the upper force transfer member and concurrently apply clamping forces to the platens as the platens move into confronting engagement.

* * * * *